(12) United States Patent
Yang et al.

(10) Patent No.: US 10,958,016 B2
(45) Date of Patent: Mar. 23, 2021

(54) ULTRA HIGH SPEED SIGNAL CABLE CONNECTOR AND ASSEMBLY METHOD THEREOF

(71) Applicant: AMPHENOL ASSEMBLETECH (XIAMEN) CO., LTD., Fujian (CN)

(72) Inventors: Wenchu Yang, Beijing (CN); Hui Tang, Beijing (CN); Weishun Chen, Beijing (CN); Hang Li, Beijing (CN); Zhenxing Liu, Beijing (CN)

(73) Assignee: AMPHENOL ASSEMBLETECH (XIAMEN) CO., LTD., Fujian (CN)

( * ) Notice: Subject to any disclaimer, the term of this patent is extended or adjusted under 35 U.S.C. 154(b) by 0 days.

(21) Appl. No.: 16/523,693

(22) Filed: Jul. 26, 2019

(65) Prior Publication Data

US 2020/0006898 A1 Jan. 2, 2020

(30) Foreign Application Priority Data

Jul. 25, 2018 (CN) .......................... 201810829628.0
Jun. 18, 2019 (CN) .......................... 201910527091.7

(51) Int. Cl.
*H01R 13/6471* (2011.01)
*H01R 13/66* (2006.01)
(Continued)

(52) U.S. Cl.
CPC ....... *H01R 13/6471* (2013.01); *H01R 12/707* (2013.01); *H01R 13/504* (2013.01); *H01R 13/582* (2013.01); *H01R 13/6658* (2013.01)

(58) Field of Classification Search
CPC ........ H01R 12/594–598; H01R 9/0515; H01R 9/0792; H01R 43/24; H01R 13/6471;
(Continued)

(56) References Cited

U.S. PATENT DOCUMENTS 4,602,832 A * 7/1986 Cunningham ..... H01R 13/6592
439/108
5,664,964 A * 9/1997 Crofoot .............. H01R 13/5845
439/495

(Continued)

*Primary Examiner* — Gary F Paumen
(74) *Attorney, Agent, or Firm* — von Briesen & Roper, s.c.

(57) ABSTRACT

An ultra high speed signal cable connector includes an insulating housing, a PCB fixedly mounted inside the insulating housing, and at least one row of cables without grounding wires welded to the PCB. The end portion of a connecting finger of the PCB extends out of the insulating housing, and the PCB is provided with a signal bonding pad and a grounding wire bonding pad. Each cable without grounding wires includes a plurality of electric wires, a conductive jacket for wrapping the plurality of electric wires together, and an insulating jacket wrapped on the outer layer of the conductive jacket. Each electric wire includes a core wire and an insulating layer wrapped on the outer layer of the core wire. One ends of the core wires are welded on the signal bonding pad; a section of insulating jacket is stripped from the foremost end of each cable without grounding wires to expose the conductive jacket. The conductive jackets are electrically and fixedly connected to the grounding wire bonding pad. According to the ultra high speed signal cable connector provided by the present disclosure, there is no need to weld the grounding wire during welding, the welding efficiency can be significantly improved, the connector is compact in structure, small in occupied space and high in strength, and the inner mold is adopted to wrap the welding spots between the cables and the PCB, so that the welding spots are protected, and the electrical performance is significantly improved compared with that of the existing products.

19 Claims, 21 Drawing Sheets

(51) Int. Cl.
*H01R 13/504* (2006.01)
*H01R 12/70* (2011.01)
*H01R 13/58* (2006.01)

(58) Field of Classification Search
CPC ............ H01R 13/6658; H01R 13/504; H01R 13/707; H01R 13/582
USPC ....................................... 439/579, 581, 606
See application file for complete search history.

(56) References Cited

U.S. PATENT DOCUMENTS

| | | | | |
|---|---|---|---|---|
| 7,001,213 B2 * | 2/2006 | Kaneko | ................ | H01R 9/0524 |
| | | | | 439/497 |
| 7,361,049 B2 * | 4/2008 | Nagata | ................ | H01R 12/598 |
| | | | | 439/497 |
| 7,520,774 B2 * | 4/2009 | Watanabe | .............. | H01R 9/037 |
| | | | | 439/260 |
| 7,670,154 B2 * | 3/2010 | Yu | ......................... | H01R 4/184 |
| | | | | 439/579 |
| 7,878,843 B2 * | 2/2011 | Zhang | ................. | H01R 12/7029 |
| | | | | 439/497 |
| 7,896,689 B1 * | 3/2011 | Su | .......................... | H01R 9/032 |
| | | | | 439/497 |
| 8,298,009 B2 * | 10/2012 | Elkhatib | .............. | H01R 12/594 |
| | | | | 439/581 |
| 2005/0070159 A1 * | 3/2005 | Lee | ........................ | H01R 43/18 |
| | | | | 439/606 |
| 2005/0075009 A1 * | 4/2005 | Ko | .......................... | H01R 9/035 |
| | | | | 439/579 |
| 2006/0252310 A1 * | 11/2006 | Yamada | ............... | H01R 9/0512 |
| | | | | 439/579 |
| 2008/0014789 A1 * | 1/2008 | Matsuoka | ............ | H01R 12/592 |
| | | | | 439/579 |
| 2008/0085632 A1 * | 4/2008 | Benham | ............... | H01R 9/0515 |
| | | | | 439/579 |
| 2009/0104813 A1 * | 4/2009 | Chen | ..................... | H01R 9/038 |
| | | | | 439/581 |
| 2016/0079689 A1 * | 3/2016 | Wu | ...................... | B23K 1/0016 |
| | | | | 439/581 |

\* cited by examiner

ULTRA HIGH SPEED SIGNAL CABLE CONNECTOR AND ASSEMBLY METHOD THEREOF

This application claims the priority and benefit of Chinese Patent Application CN201810829628.0 filed on Jul. 25, 2018 and Chinese Patent Application CN201910527091.7 filed on Jun. 18, 2019, which is incorporated herein by reference in its entirety.

FIELD

The present disclosure belongs to the field of connectors, and more particularly, to an ultra high speed signal cable connector and an assembly method.

BACKGROUND

The high speed signal cable connector can be divided into a connector for cables with grounding wires and an ultra high speed signal cable connector. The connector for cables with grounding wires usually has the following disadvantages in application and assembly process: grounding wires needed to be welded during welding; the welding efficiency is low; and in the case of the same wire size, the cable with grounding wires has a larger size than the cable without grounding wires and takes up more space in the chassis. Therefore, it is necessary to design a cable connector which is compact in structure, small in occupied space, convenient to weld and high in transmission efficiency.

SUMMARY

An objective of the present disclosure is to provide an ultra high speed signal cable connector which has the characteristics of being compact in structure, small in occupied space, convenient to weld and high in transmission efficiency, and an assembly method.

In order to achieve the above objective, the technical solution used in the present disclosure is as follows.

The ultra high speed signal cable connector includes an insulating housing, a PCB fixedly mounted inside the insulating housing, and at least one row of cables without grounding wires welded to the PCB. The end portion of a connecting finger of the PCB extends out of the insulating housing, and the PCB is provided with a signal bonding pad and a grounding wire bonding pad. Each cable without grounding wires includes a plurality of electric wires, a conductive jacket for wrapping the plurality of electric wires together, and an insulating jacket wrapped on the outer layer of the conductive jacket; and each electric wire includes a core wire and an insulating layer wrapped on the outer layer of the core wire. One ends of the core wires are welded on the signal bonding pad, a section of insulating jacket is stripped from the foremost end of each cable without grounding wires to expose the conductive jacket, and the conductive jackets are electrically and fixedly connected to the grounding wire bonding pad.

Preferably, two rows of cables without grounding wires are provided, and the two rows of cables without grounding wires are symmetrically disposed on the upper side and the lower side of the PCB.

Preferably, the conductive jackets of the two rows of cables without grounding wires are fixed to the grounding wire bonding pad by plastic.

Preferably, the conductive jackets of the upper and lower rows of cables without grounding wires are fixed to the grounding wire bonding pad by conductive glue.

Preferably, the conductive jackets of the upper and lower rows of cables without grounding wires are electrically and fixedly connected to the grounding wire bonding pad by conductive rubber, the conductive rubber is pre-mounted on the PCB before the cables without grounding wires are welded to the PCB, and the conductive jackets on the cables without grounding wires are electrically and fixedly connected to the grounding wire bonding pad by the interference fit between the insulating housing and the cables without grounding wires.

Preferably, the conductive jackets of the upper and lower rows of cables without grounding wires are electrically and fixedly connected to the grounding wire bonding pad by a ground lug, the ground lug is first fixed to the grounding wire bonding pad by means of welding or SMT, the ground lug is provided with a plurality of riveting claws for accommodating the cables, the cables are placed in the riveting claws in one-to-one correspondence, and bending jigs are adopted for riveting and fixing.

Preferably, the signal bonding pad is alternately provided with a plurality of grounding terminals, the conductive jackets of the upper and lower rows of cables without grounding wires are electrically and fixedly connected to the grounding wire bonding pad by a signal pair spacer, the signal pair spacer comprises a spacer main body and a plurality of pins extending forward from the front end of the spacer main body, the pins are welded on the grounding terminals, and the cables without grounding wires, the main spacer body and the grounding wire bonding pad are conducted together through the extruding interference of the insulating housing.

Preferably, the spacer main body is disposed above the cables without grounding wires or is disposed between the cables without grounding wires and the grounding wire bonding pad.

Preferably, the insulating housing comprises a front housing and a rear housing, the rear portion of the front housing is provided with a plurality of clamping grooves, the front portion of the rear housing is provided with a plurality of buckles, the rear housing is assembled with the front housing together through the matching of the buckles and the clamping grooves, the top of the front housing is provided with a mounting groove for mounting a spring plate, the front end of the front housing is provided with a guiding hole, and the end portion of the connecting finger of the PCB passes through the guiding hole and extends out of the front housing.

Preferably, the front housing is internally provided with sliding groove tracks, two sides of the PCB are each provided with a guiding block, and the PCB is mounted on the sliding groove tracks by the guiding blocks.

Preferably, the spring plate comprises a mounting portion and a connecting portion formed by obliquely bending upward from the rear end of the mounting portion, the front end of the mounting portion is provided with elastic catches, the mounting groove is internally provided with a plurality of clamping points, and the mounting portion is provided with a plurality of limiting bayonets matched with the clamping points.

Preferably, the interior of the insulating housing is provided with an inner mold for covering welding spots between all the cables without grounding wires and the PCB, and the side of the insulating housing is provided with a melted plastic injection hole for injection molding of the inner mold.

Preferably, the connector further includes a pressing device, wherein the pressing device comprises a first base plate and connecting members, the first base plate is perpendicularly attached to the outer circumferences of the cables without grounding wires, and the connecting members are connected to the first base plate and the PCB to press the cables without grounding wires and the PCB.

Preferably, the pressing device further comprises a second base plate parallel to the first base plate, the cables without grounding wires are disposed on two sides of the PCB, the first base plate is attached to the outer circumferences of cables without grounding wires on one side of the PCB, and the second base plate is attached to the outer circumferences of cables without grounding wires on other side of the PCB; the connecting members are sequentially connected to the first base plate, the PCB and the second base plate to press the cables without grounding wires and the PCB; and the first base plate and the second base plate are both metal plates.

Preferably, the sides, attached to the cables without grounding wires, of the first base plate and the second base plate are provided with grooves for accommodating the cables without grounding wires.

Preferably, the groove bottoms of the grooves are provided with a plurality of dividing strips disposed in parallel with the cables without grounding wires and used for dividing the cables without grounding wires.

Preferably, the connecting members are rivets, two ends of the PCB are provided with first positioning holes, two ends of the first base plate and two ends of the second base plate are provided with second positioning holes, and the rivets pass through the first positioning holes and the second positioning holes to rivet the first base plate and the second base plate onto the PCB.

Preferably, the connecting members are bolts, two ends of the PCB are provided with through holes for allowing the bolts to pass through, two ends of the PCB are provided with first positioning holes, two ends of the first base plate are provided with second positioning holes, two ends of the second base plate are provided with threaded holes, and the bolts sequentially pass through the second positioning holes and the first positioning holes and are in threaded connection to the threaded holes.

Preferably, each conductive jacket is a metal film, each insulating jacket is a plastic film, and each insulating layer is plastic.

The present disclosure further discloses the assembly method of the ultra high speed signal cable connector, including the following steps:

Step 1: welding the core wires of the cables without grounding wires to the signal bonding pad of the PCB;

Step 2: electrically and fixedly connecting the conductive jackets of the cables without grounding wires to the grounding wire bonding pad of the PCB to play a role in conducting;

Step 3: fixing the PCB in the front housing to enable the end portion of the connecting finger of the PCB to pass through the guiding hole of the front housing and extend out of the front housing;

Step 4: performing injection molding on the inner mold by the melted plastic injection hole in the side of the insulating housing to fill the inner cavity of the insulating housing with melted plastic and wrap all welding spots between the cables without grounding wires and the PCB; and Step 5: installing the spring plate into the mounting groove at the top of the front housing, and clamping the limiting bayonets on the spring plate with the clamping points in the mounting groove.

The ultra high speed signal cable connector and the assembly method thereof provided by the present disclosure have the following beneficial effects: 1, there is no need to weld grounding wires during welding, the welding efficiency can be significantly improved, the connector is compact in structure, small in occupied space and high in strength, and the inner mold is adopted to wrap the welding spots between the cables and the PCB, so that the welding spots are protected, and the electrical performance is significantly improved compared with that of the existing products; 2, the cables without grounding wires are adopted, in the case of the same wire size, the cables without grounding wires can be made smaller than the cables with grounding wires, thus saving the space in the chassis; 3, the sliding groove tracks and the front guiding hole are arranged, the PCB is fixed to the guiding hole by the sliding grooves, so that the PCB does not sway from side to side or rotate; and 4, the cables without grounding wires and the PCB are closely attached by the pressing device to avoid the problem of non-conducting during contact, so that the conducting effect is better, and the structure is simple, and not too much space is occupied.

Other characteristics and advantages of the present disclosure will be described in detail in the following detailed embodiments.

BRIEF DESCRIPTION OF THE DRAWINGS

By more detailed description of the exemplary embodiments of the present disclosure with reference to the accompanying drawings, the above and other objectives, features, and advantages of the present disclosure will become more apparent, and in the exemplary embodiments of the present disclosure, the same reference numerals generally represent the same parts.

Figure 1:
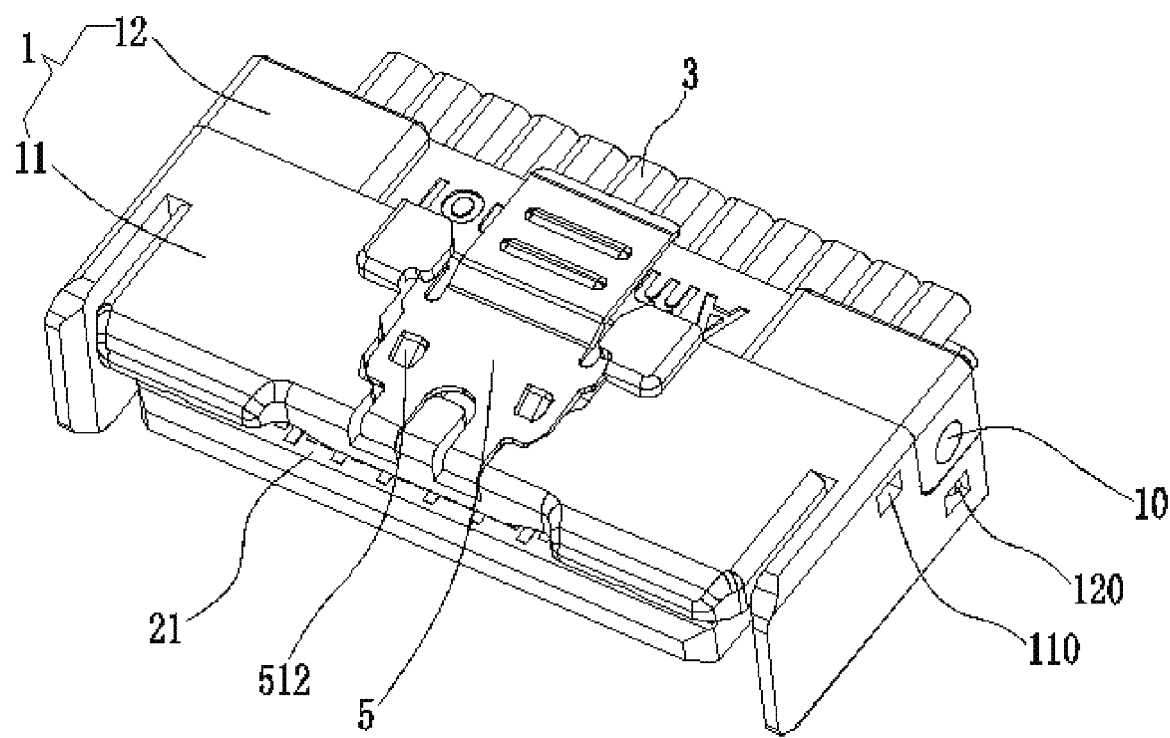
FIG. 1 shows a schematic structural diagram of an ultra high speed signal cable connector according to Embodiment 1 of the present disclosure.
Figure 2:
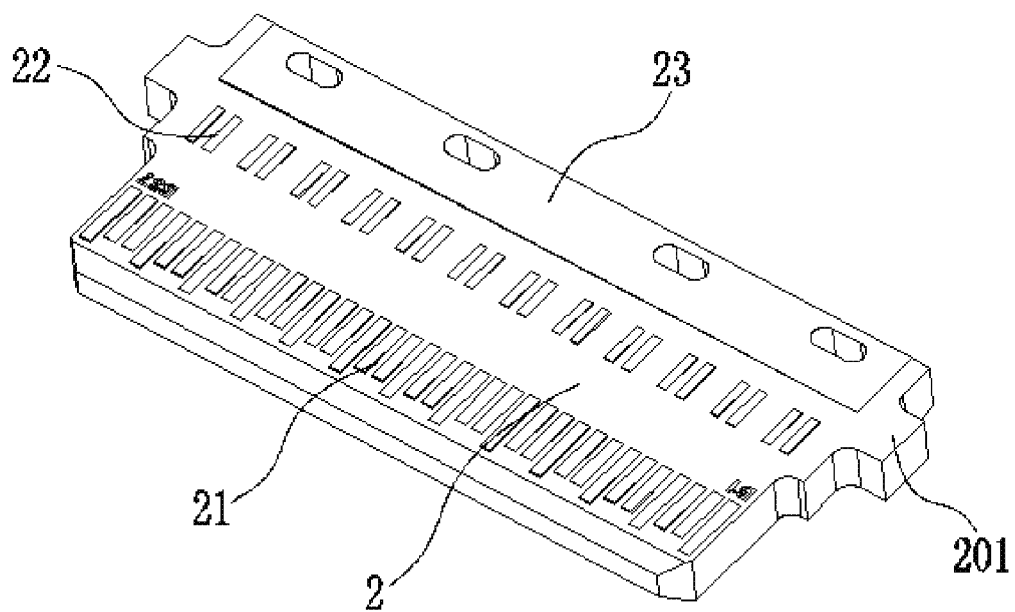
FIG. 2 shows a schematic structural diagram of a PCB of an ultra high speed signal cable connector according to Embodiment 1 of the present disclosure.
Figure 3:
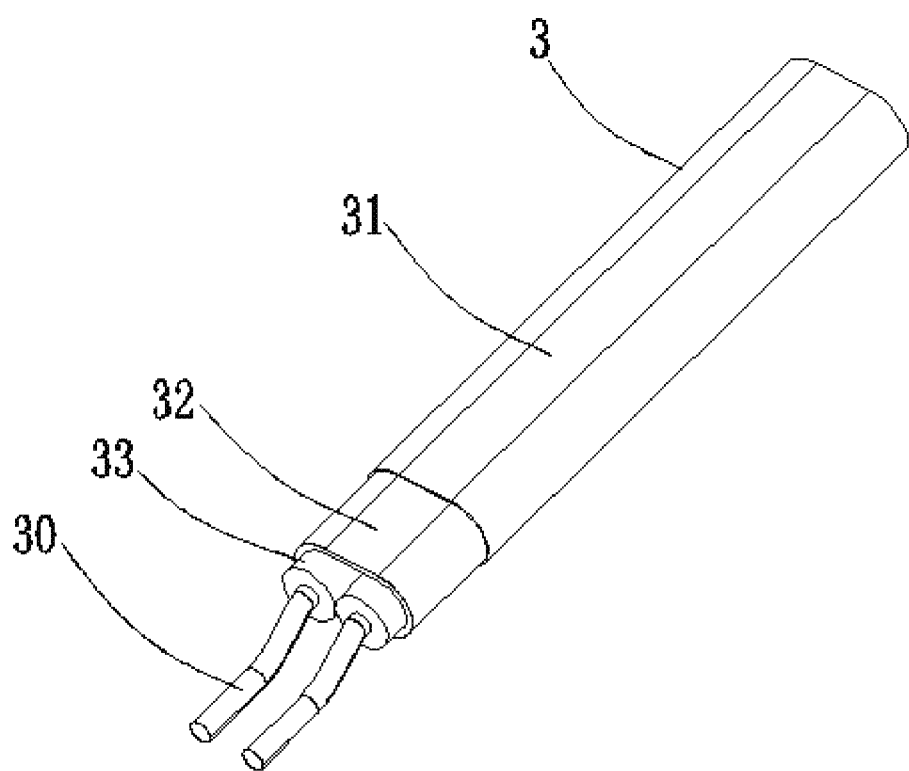
FIG. 3 shows a schematic structural diagram of wires of an ultra high speed signal cable connector according to Embodiment 1 of the present disclosure.
Figure 4:
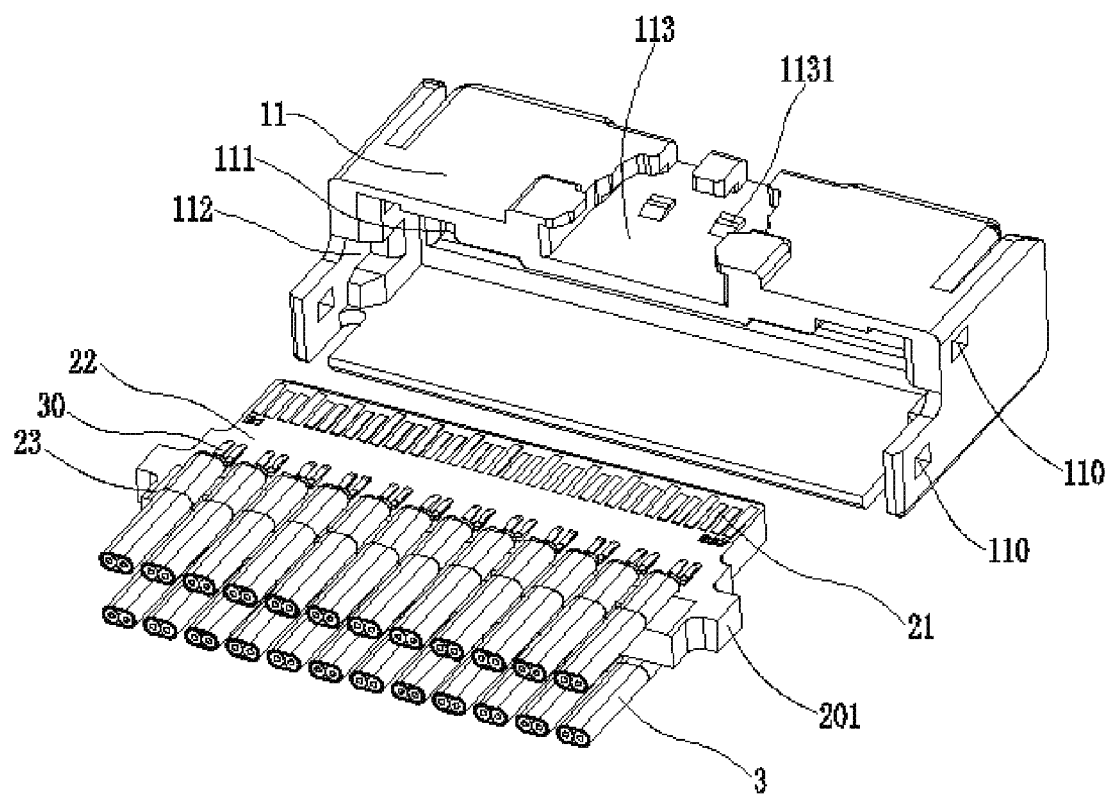
FIG. 4 shows a schematic exploded diagram of a PCB and a front housing of an ultra high speed signal cable connector according to Embodiment 1 of the present disclosure.
Figure 5:
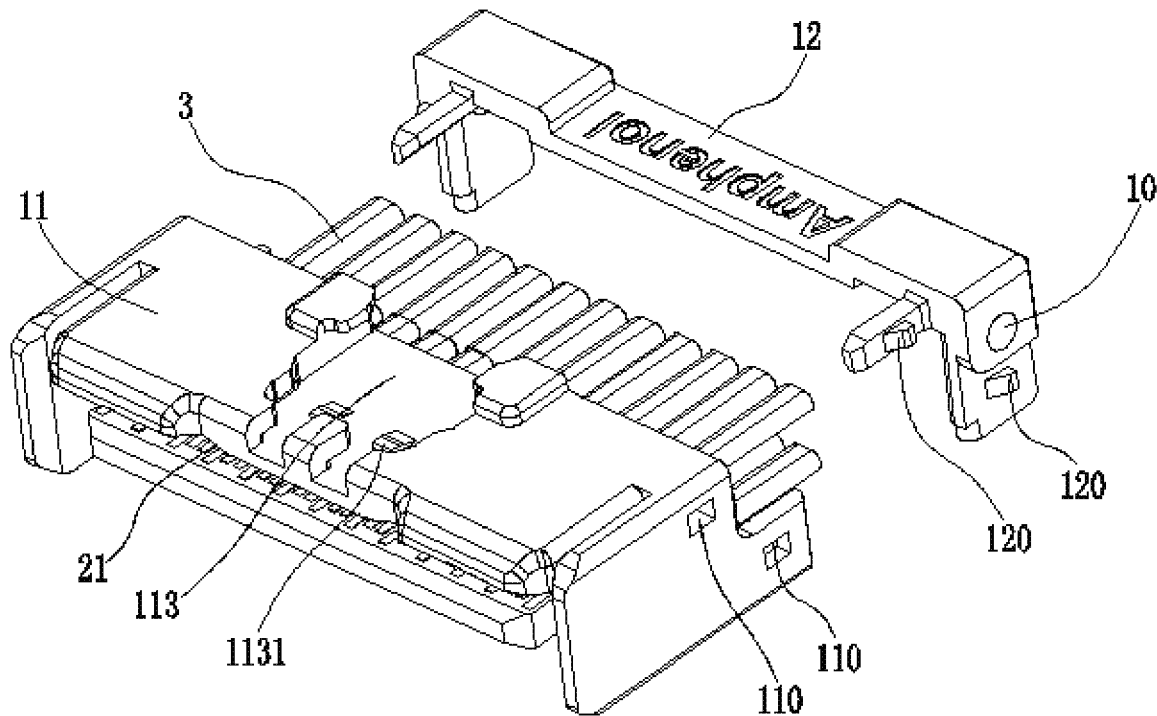
FIG. 5 shows a schematic exploded diagram of a front housing and a rear housing of an ultra high speed signal cable connector according to Embodiment 1 of the present disclosure.
Figure 6:
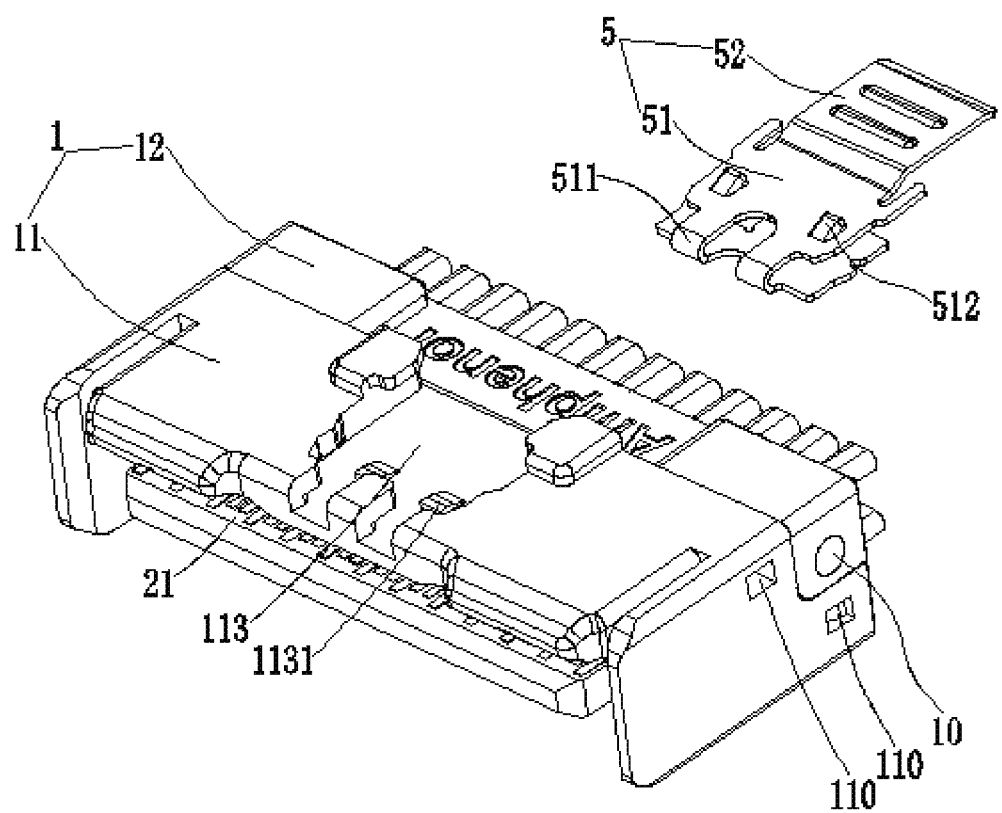
FIG. 6 shows a schematic exploded diagram of a spring plate and an insulating housing of an ultra high speed signal cable connector according to Embodiment 1 of the present disclosure.
Figure 7:
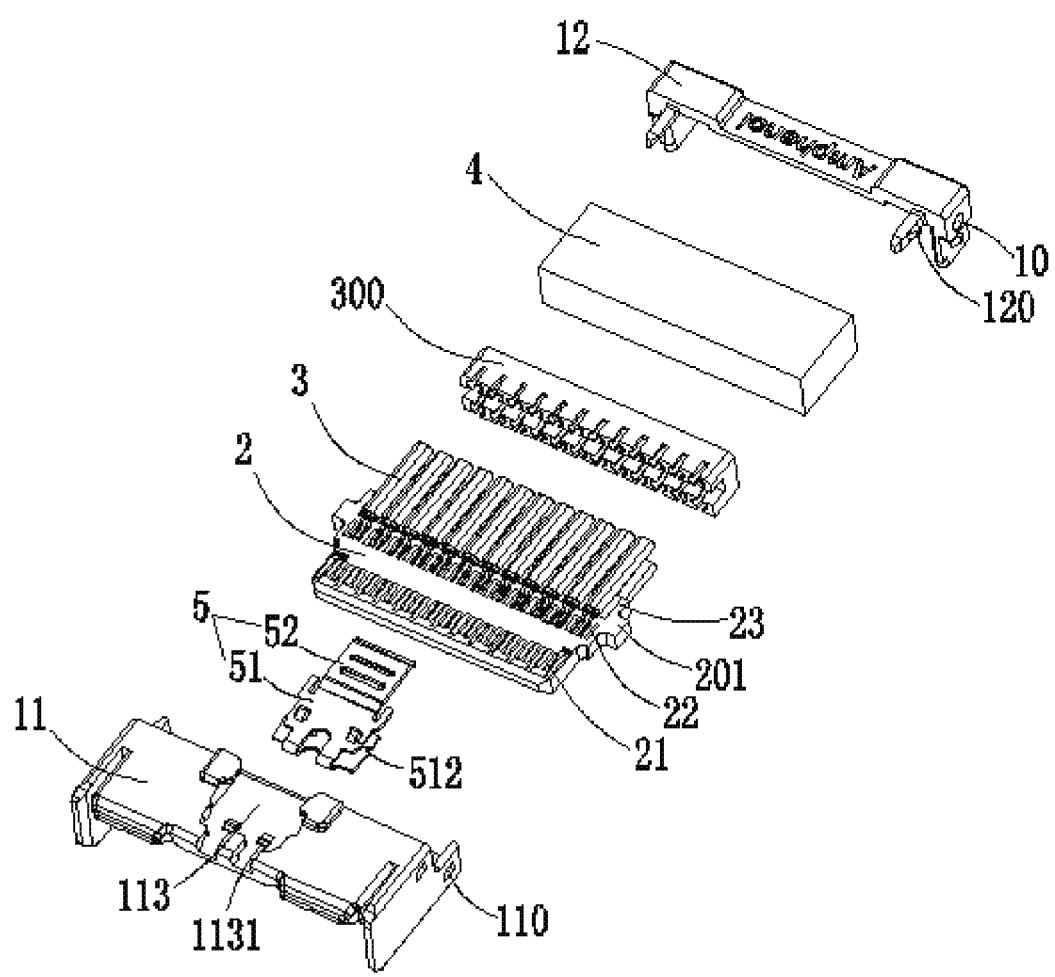
FIG. 7 shows a schematic exploded diagram of an ultra high speed signal cable connector according to Embodiment 1 of the present disclosure.
Figure 8:
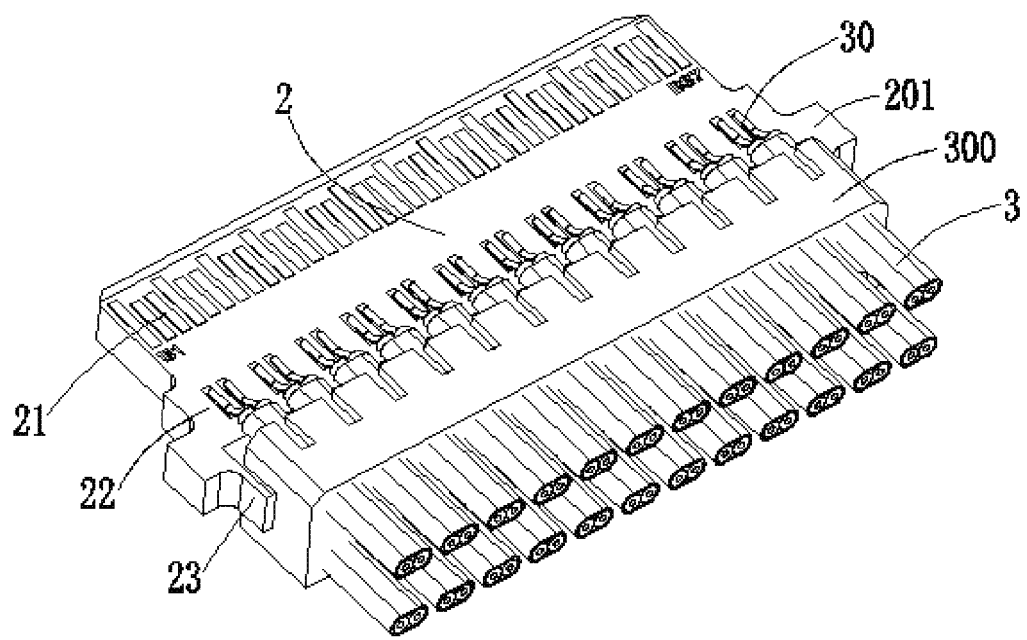
FIG. 8 shows a schematic diagram of conductive jackets of cables fixed to the grounding wire bonding pad by conductive plastic according to Embodiment 1.

Numbers in the accompanying drawings are described as follows:

1—insulating body; 10—melted plastic injection hole; 11—front housing; 110—clamping groove; 111—guiding hole; 112—sliding groove track; 113—mounting groove; 1131—clamping point; 12—rear housing; 120—buckle;

2—PCB; 201—guiding block; 21—connecting finger; 22—signal bonding pad; 221—grounding terminal; 222—signal terminal; 23—grounding wire bonding pad; 231—first positioning hole;

3—cable without grounding wires; 30—core wire; 300—conductive plastic; 31—insulating jacket; 32—conductive jacket; 33—insulating layer;

4—inner mold; 5—spring plate; 51—mounting portion; 511—elastic catch; 512—limiting bayonet; 52—connecting portion;

61—first base plate; 611—groove; 612—second positioning hole; 62—second base plate, 621—dividing strip; 622—threaded hole; 7—connecting member; 8—conductive glue; 9—conductive rubber; 100—ground lug; 1001—U-shaped riveting claw; 200—signal pair spacer; 2001—spacer main body; 2002—pin.

DETAILED DESCRIPTION OF THE EMBODIMENTS

Preferred embodiments of the present disclosure will be described in more detail below. Though the preferred embodiments of the present disclosure are described below, it should be understood that the present disclosure may be embodied in various forms and not limited by the embodiments set forth herein. On the contrary, these embodiments are provided to make the present disclosure more thorough and complete and fully convey the scope of the present disclosure to those skilled in the art.

Embodiment 1

As shown in FIG. 1-8, an ultra high speed signal cable connector includes an insulating housing 1, a PCB 2, and two rows of cables without grounding wires 3, The two rows of cables without grounding wires 3 are symmetrically disposed on the upper side and the lower side of the PCB 2. The front end of the PCB 2 is provided with a connecting finger 21, the middle position of the PCB 2 is provided with a signal bonding pad 22, the tail portion of the PCB 2 is provided with a grounding wire bonding pad 23, and the end portion of the connecting finger 21 extends out of the insulating housing 1.

Each cable without grounding wires 3 includes a plurality of electric wires, a conductive jacket 32 for wrapping the plurality of electric wires together, and an insulating jacket 31 wrapped on the outer layer of the conductive jacket 32; each electric wire includes a core wire 30 and an insulating layer 33 wrapped on the outer layer of the core wire 30; one ends of all the core wires 30 are welded on the signal bonding pad 22; and a section of insulating jacket 31 is stripped from the foremost end of each cable without grounding wires 3 to expose the conductive jacket 32.

Each conductive jacket 32 is a metal film, each insulating jacket 31 is a plastic film, and each insulating layer 33 is plastic.

The conductive jackets 32 of the upper and lower rows of cables without grounding wires 3 are electrically and fixedly to the grounding wire bonding pad 23 of the PCB 2 by conductive plastic 300, the welding spots between the cables without grounding wires 3 and the PCB 2 are fixed and protected by an inner mold 4, and a melted plastic injection hole 10 for injection molding of the inner mold 4 is formed in the side of the insulating housing 1.

The insulating housing 1 includes a front housing 11 and a rear housing 12, and the rear portion of the front housing 11 is provided with two clamping grooves 110, the front portion of the rear housing 12 is provided with two buckles 120 corresponding to the clamping grooves in position, and the rear housing 12 is assembled with the front housing 11 together through the matching of the buckles 120 and the clamping grooves 110. The front end of the front housing 11 is provided with a guiding hole 111, and the end portion of the connecting finger 21 of the PCB 2 passes through the guiding hole 111 and extends out of the front housing 11. The front housing 11 is internally provided with sliding groove tracks 112, two sides of the PCB 2 are each provided with a guiding block 201, and the PCB 2 is mounted on the sliding groove tracks 112 by the guiding blocks 201.

The top of the front housing 11 is provided with a mounting groove 113 for mounting a spring plate 5. The spring plate 5 includes a mounting portion 51 and a connecting portion 52 formed by obliquely bending upward from the rear end of the mounting portion 51, the front end of the mounting portion 51 is provided with elastic catches 511, the mounting groove 113 is provided with two clamping points 1131, and the mounting portion 51 is provided with two limiting bayonets 512 matched with the clamping points 1131.

Embodiment 2

Figure 9:
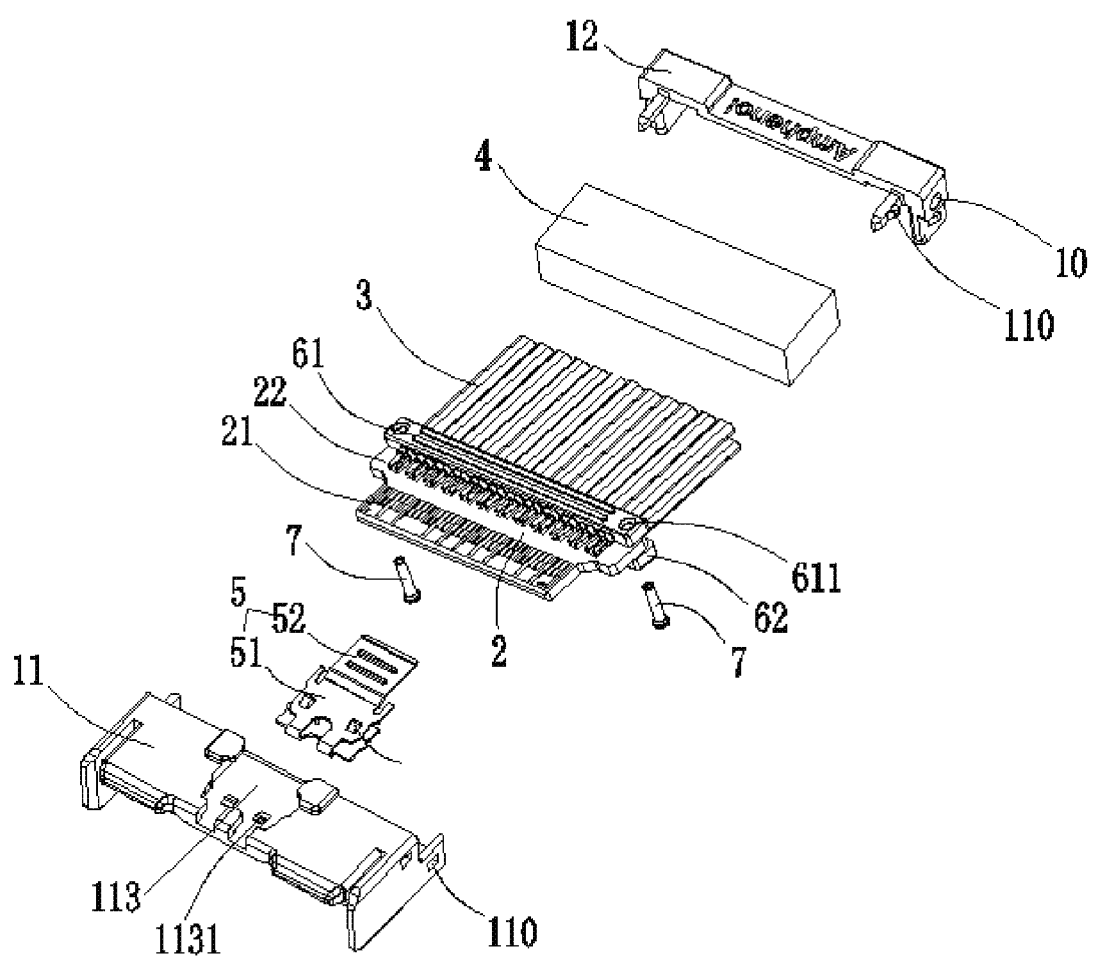
FIG. 9 shows a schematic exploded diagram of an ultra high speed signal cable connector according to Embodiment 2.
Figure 10:
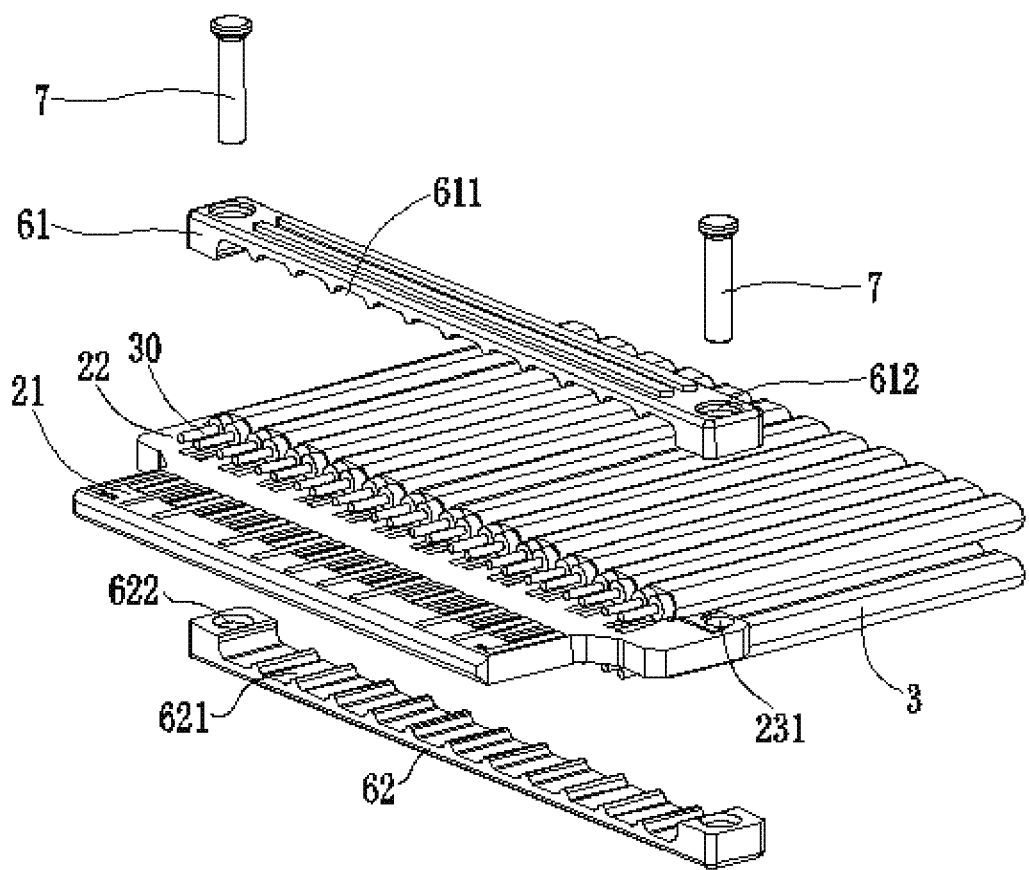
FIG. 10 shows a schematic diagram of a pressing device according to Embodiment 2.

As shown in FIG. 9 and FIG. 10, differences between this embodiment and Embodiment 1 are as follows:

the connector further includes a pressing device, wherein the pressing device includes a first base plate 61, a second base plate 62 parallel to the first base plate 61, and connecting members 7, the first base plate 61 is perpendicularly attached to the outer circumferences of the cables without grounding wires 3, namely, the outer walls of the insulating layers 33. The cables without grounding wires 3 are disposed on two sides of the PCB 2, the second base plate 62 is attached to the outer circumferences of cables without grounding wires 3 on the other side of the PCB 2, namely, the outer walls of the insulating layers 33. The first base plate 61 and the second base plate 62 are both metal plates.

The connecting members 7 are rivets, two ends of the PCB 2, namely, the left and right ends of the grounding wire bonding pad 23 are provided with first positioning holes 231 for allowing the rivets to pass through, two ends of the first base plate 61 and two ends of the second base plate 62 are provided with second positioning holes 612, and the rivets pass through the first positioning holes 321 and the second positioning holes 612 to rivet the first base plate 61 and the second base plate 62 onto the PCB 2.

Embodiment 3

Figure 11:
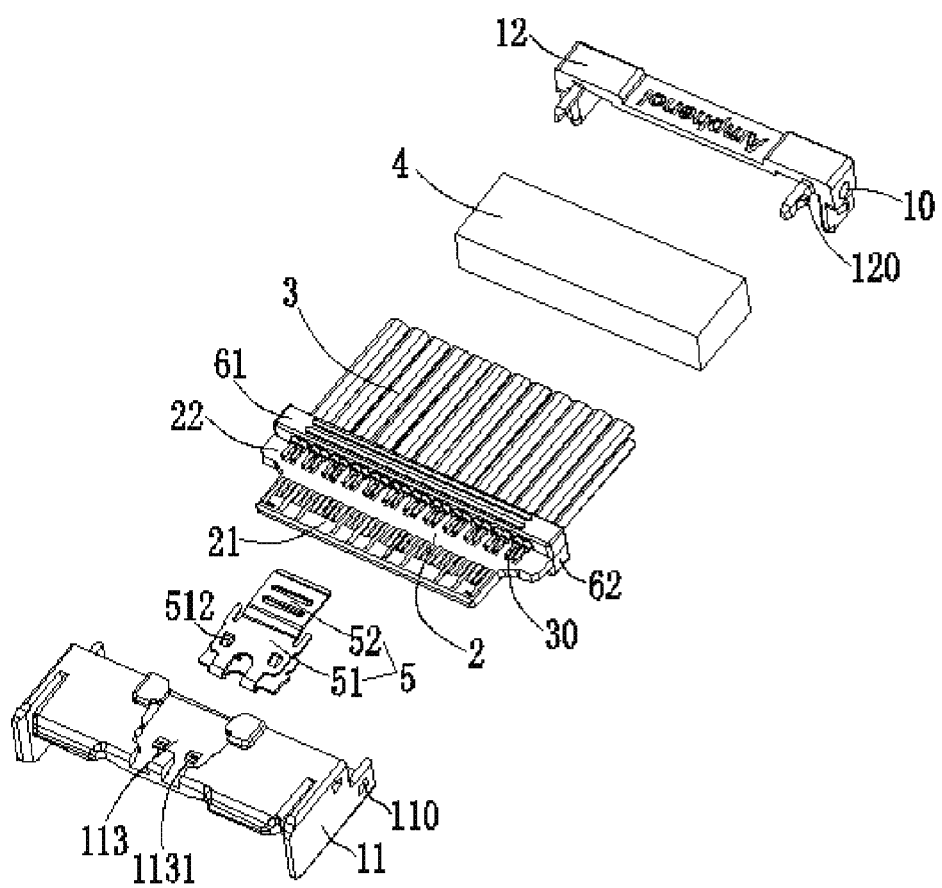
FIG. 11 shows a schematic exploded diagram of an ultra high speed signal cable connector according to Embodiment 3.
Figure 12:
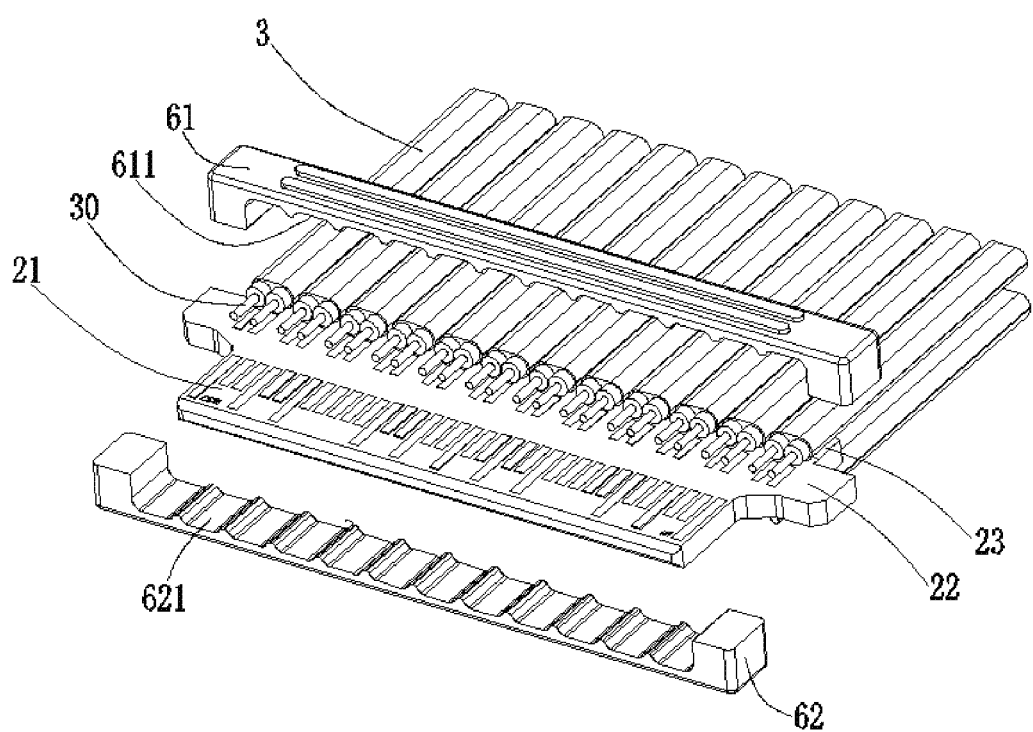
FIG. 12 shows a schematic diagram of upper and lower positioning bars fixed by tinplating according to Embodiment 3.

As shown in FIG. 11 and FIG. 12, differences between this embodiment and Embodiment 1 are as follows:

the connector further includes a pressing device, wherein the pressing device includes a first base plate 61 and a second base plate 62 parallel to the first base plate 61, and the first base plate 61 is perpendicularly attached to the outer circumferences of the cables without grounding wires 3, namely, the outer walls of the insulating layers 33. The cables without grounding wires 3 are disposed on two sides of the PCB 2, the second base plate 62 is attached to the outer circumferences of cables without grounding wires 3 on the other side of the PCB, namely, the outer walls of the insulating layers 33. The first base plate 61 and the second base plate 62 are both metal plates, and are pressed by jigs.

The sides, attached to the cables without grounding wires 3, of the first base plate 61 and the second base plate 62 are provided with grooves 611 for accommodating the cables without grounding wires 3; and the connecting pieces are weld legs, and the first base plate 61 and the second base plate 62 are fixed to the grounding wire bonding pad 23 by soldering tin at the gap between the grooves 611 and the cables without grounding wires 3.

Embodiment 4

Figure 13:
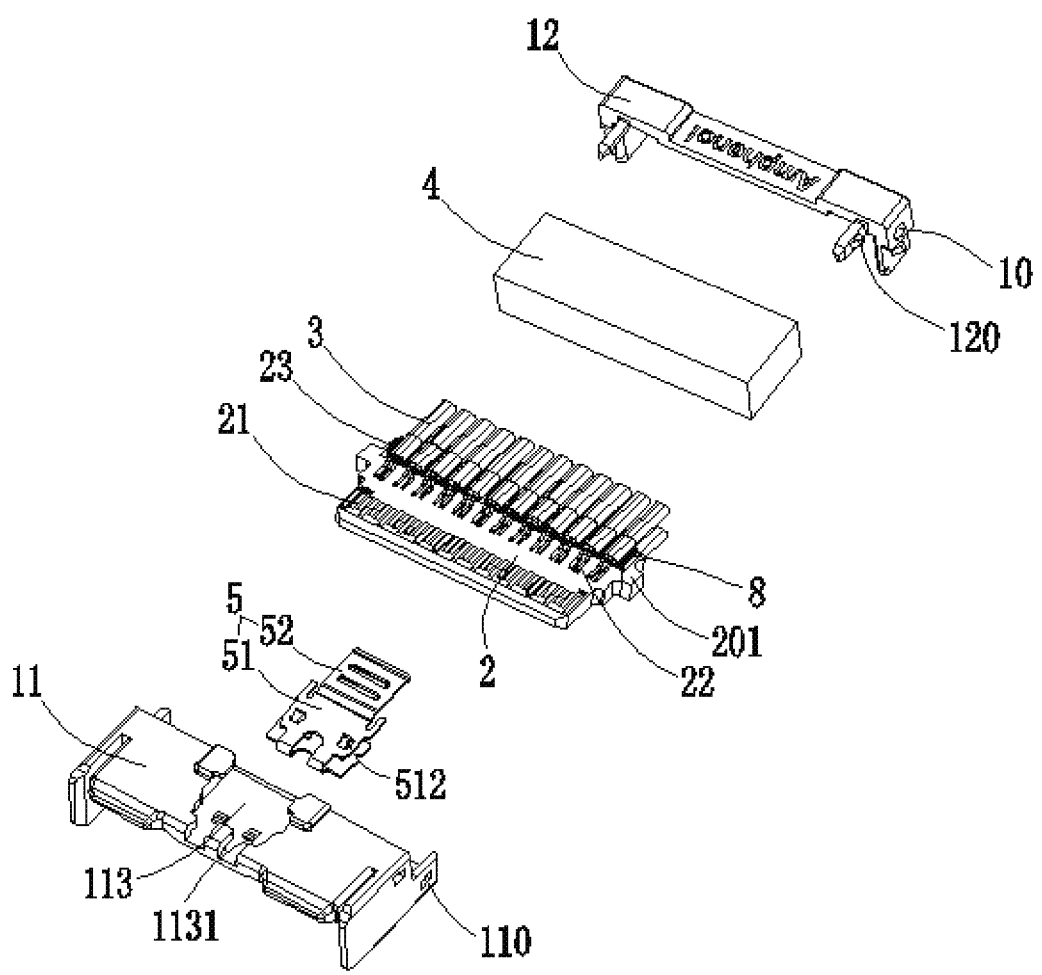
FIG. 13 shows a schematic exploded diagram of an ultra high speed signal cable connector according to Embodiment 4.
Figure 14:
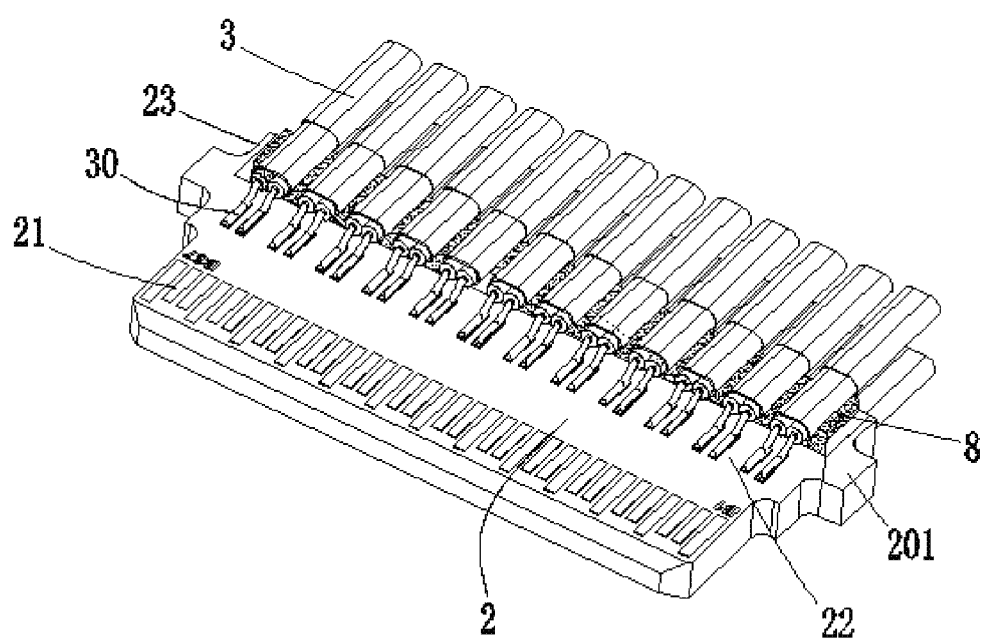
FIG. 14 shows a schematic diagram of conductive jackets of cables fixed to the grounding wire bonding pad by conductive glue according to Embodiment 4.

As shown in FIG. 13 and FIG. 14, differences between this embodiment and Embodiment 1 are as follows:

the conductive jackets of the upper and lower rows of cables without grounding wires 3 are fixed to the grounding wire bonding pad 23 by conductive glue 8.

Embodiment 5

Figure 15:
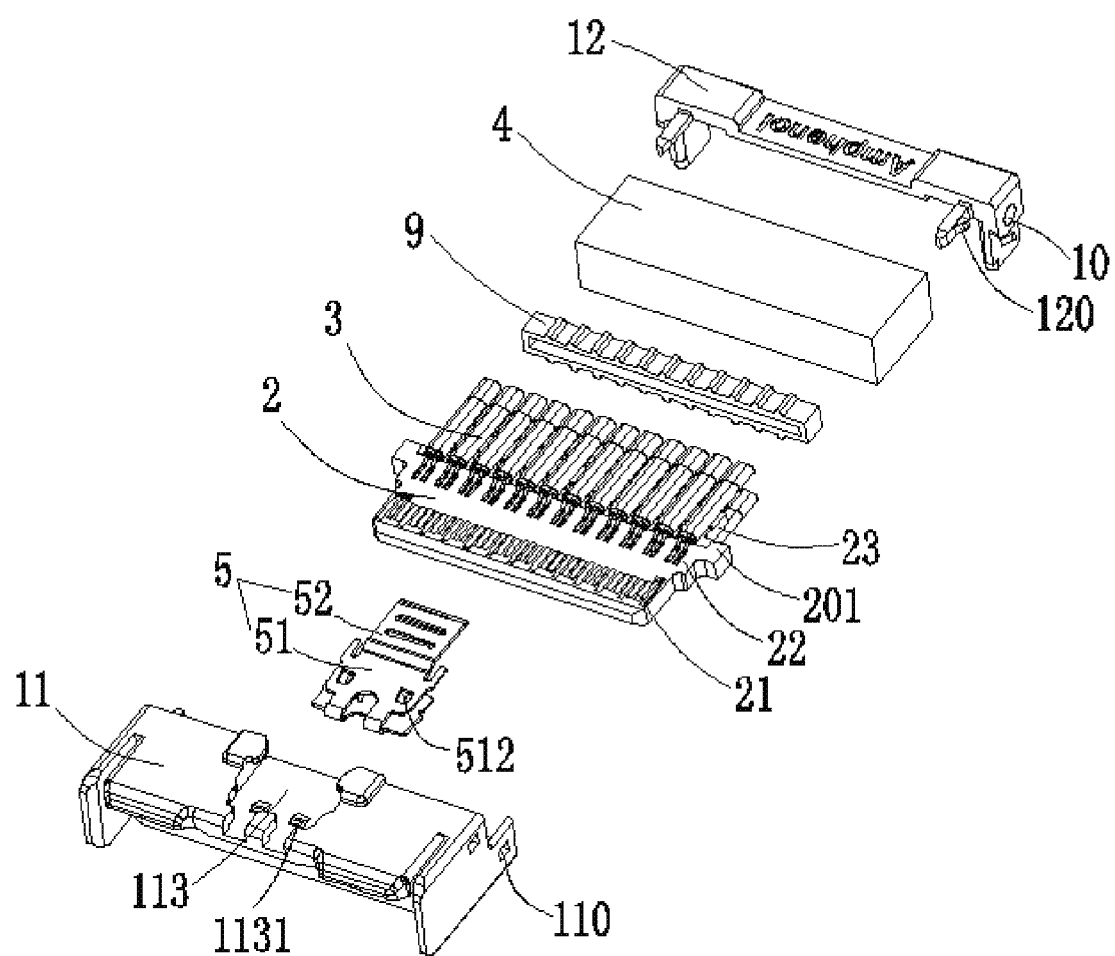
FIG. 15 shows a schematic exploded diagram of an ultra high speed signal cable connector according to Embodiment 5.
Figure 16:
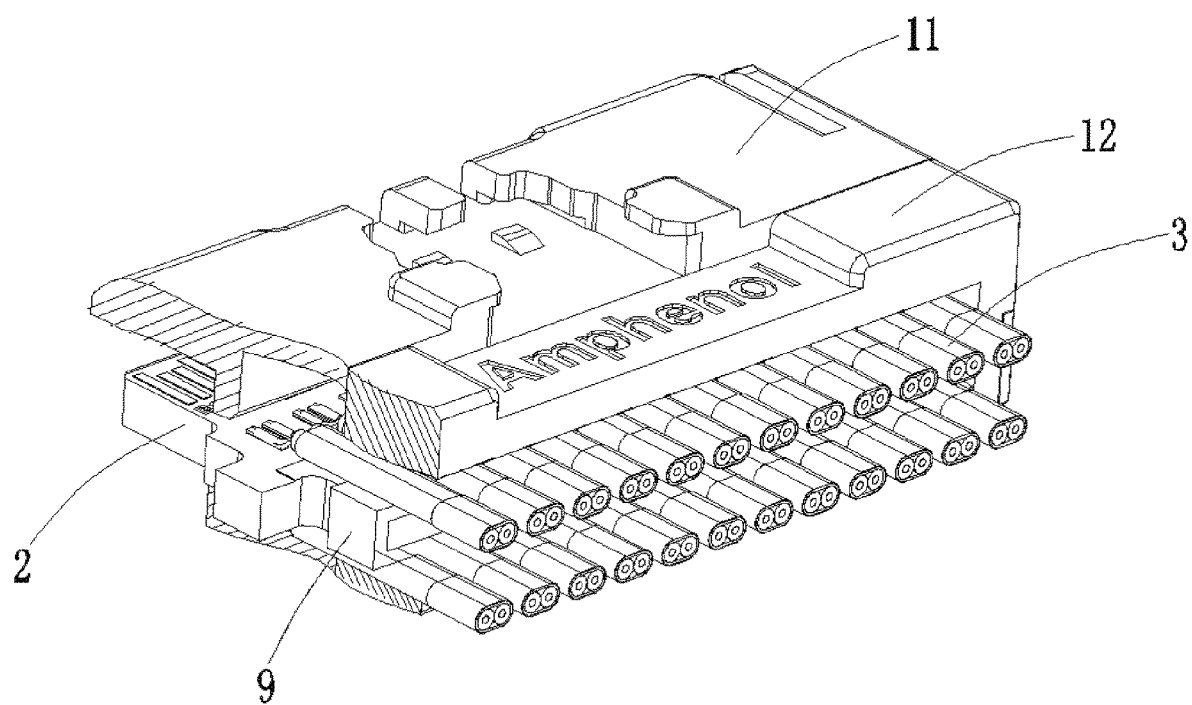
FIG. 16 shows a schematic assembled diagram of an ultra high speed signal cable connector according to Embodiment 5.

As shown in FIG. 15 and FIG. 16, differences between this embodiment and Embodiment 1 are as follows:

Conductive rubber 9 is pre-mounted on the PCB before the cables without grounding wires 3 are welded to the PCB 2, and by the interference fit extruding of the front housing 11, the rear housing 12 and the cables without grounding wires 3, the cables without grounding wires 3, the conductive rubber 9 and the grounding wire bonding pad 23 are in close fit to indirectly realize the electrical and fixed connection of the conductive jackets 32 on the cables without grounding wires 3 and the grounding wire bonding pad 23.

Embodiment 6

Figure 17:
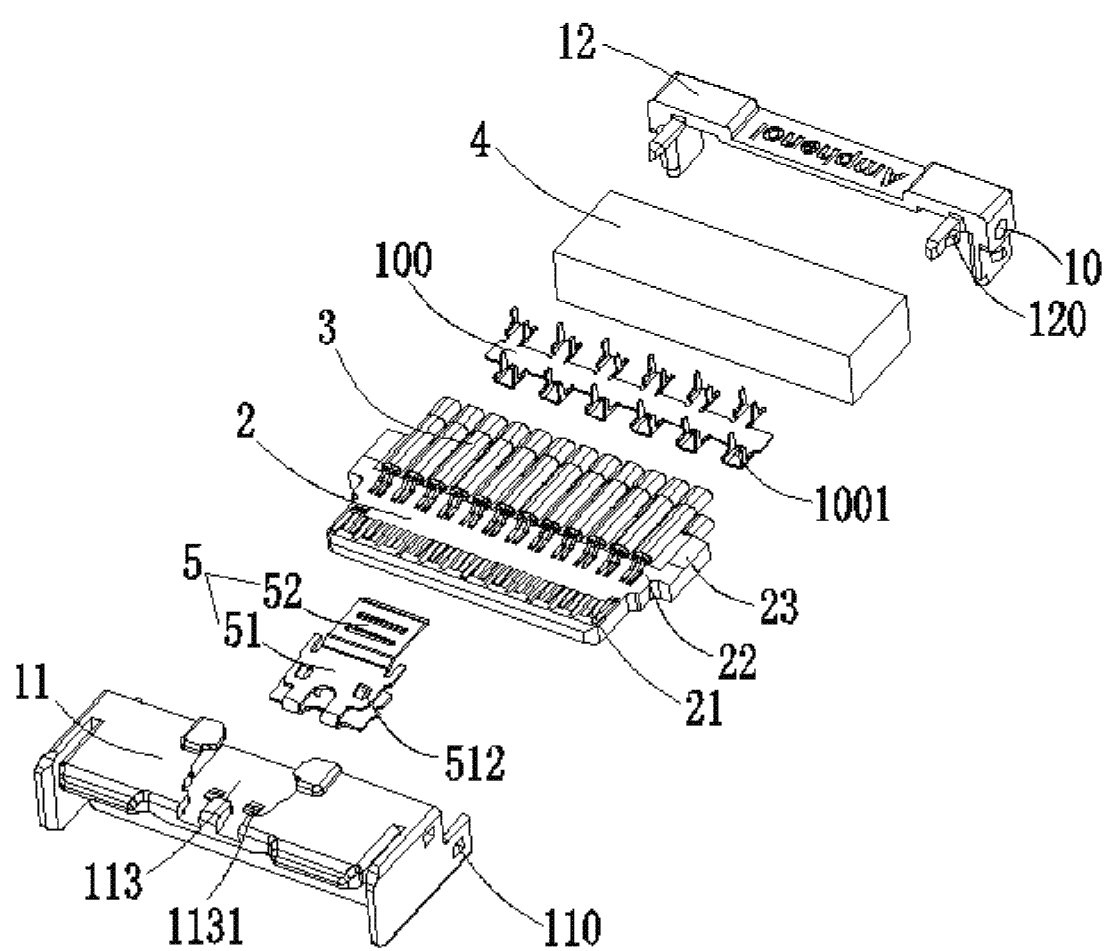
FIG. 17 shows a schematic exploded diagram of an ultra high speed signal cable connector according to Embodiment 6.
Figure 18:
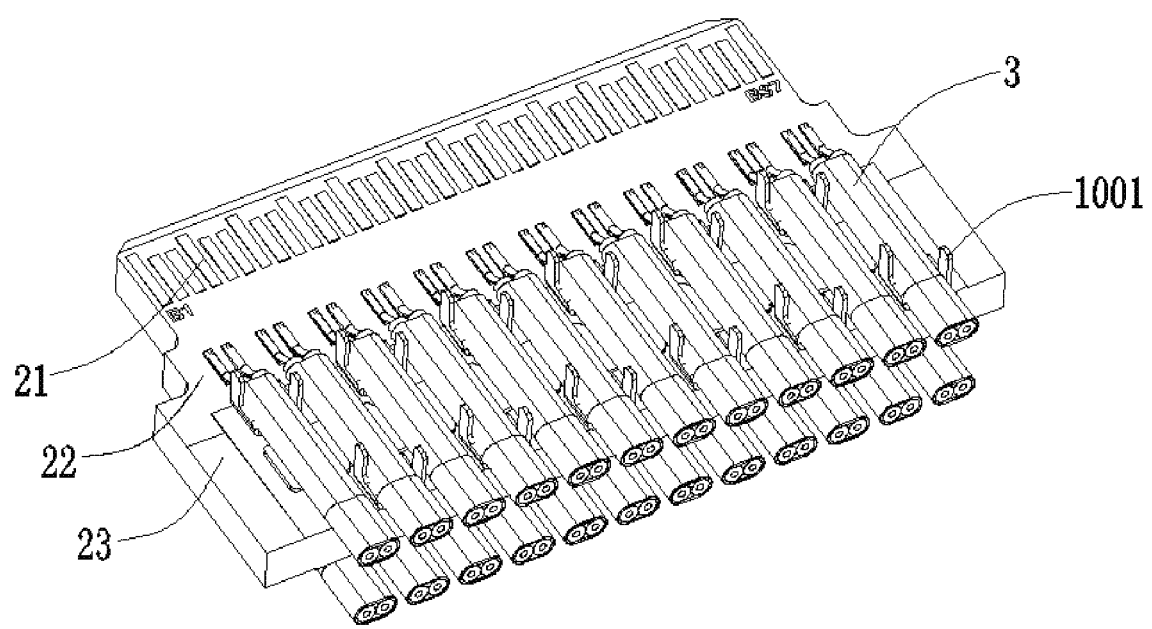
FIG. 18 shows a schematic diagram of conductive jackets of cables fixed to the grounding wire bonding pad by a ground lug according to Embodiment 6.
Figure 19:
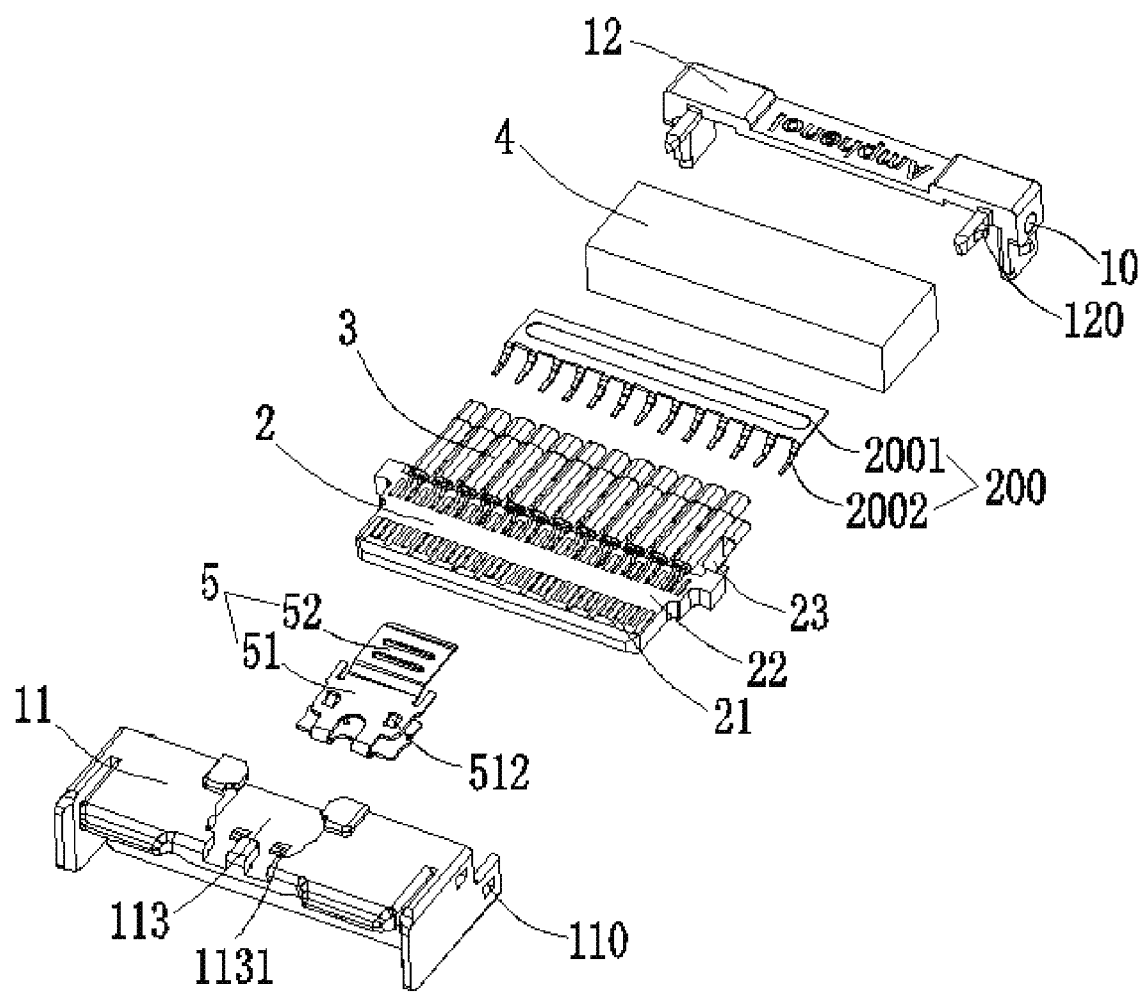
FIG. 19 shows a schematic exploded diagram of an ultra high speed signal cable connector according to Embodiment 7.

As shown in FIG. 17 and FIG. 18, differences between this embodiment and Embodiment 1 are as follows:

before the cables without grounding wires 3 are welded, a ground lug 100 is first fixedly connected to the grounding wire bonding pad 23 by means of welding, the cables without grounding wires 3 are placed in U-shaped riveting claws 1001 of the ground lug 100 in one-to-one correspondence and the U-shaped riveting claws 1001 are riveted by bending jigs, so that the ground lug 100 is fixedly connected to the cables without grounding wires 3 to achieve the electrical and fixed connection of the cables without grounding wires 3 and the grounding wire bonding pad 23.

Embodiment 7

Figure 20:
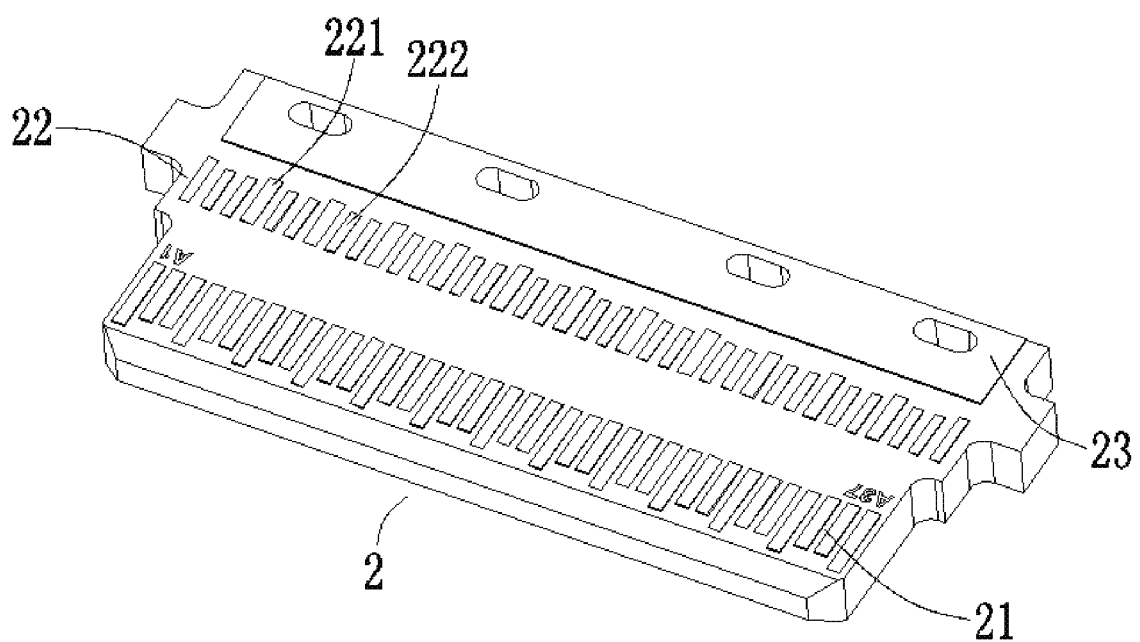
FIG. 20 shows a schematic structural diagram of a PCB according to Embodiment 7.
Figure 21:
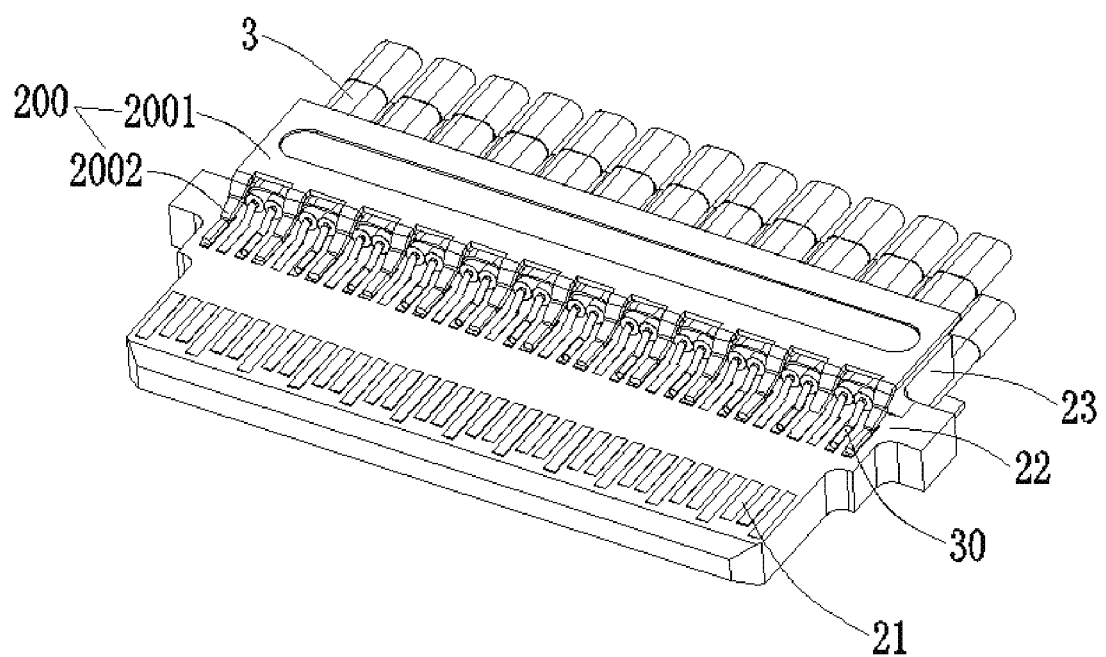
FIG. 21 shows a collaboration schematic diagram of a spacer main body disposed above cables without grounding wires according to Embodiment 7.
Figure 22:
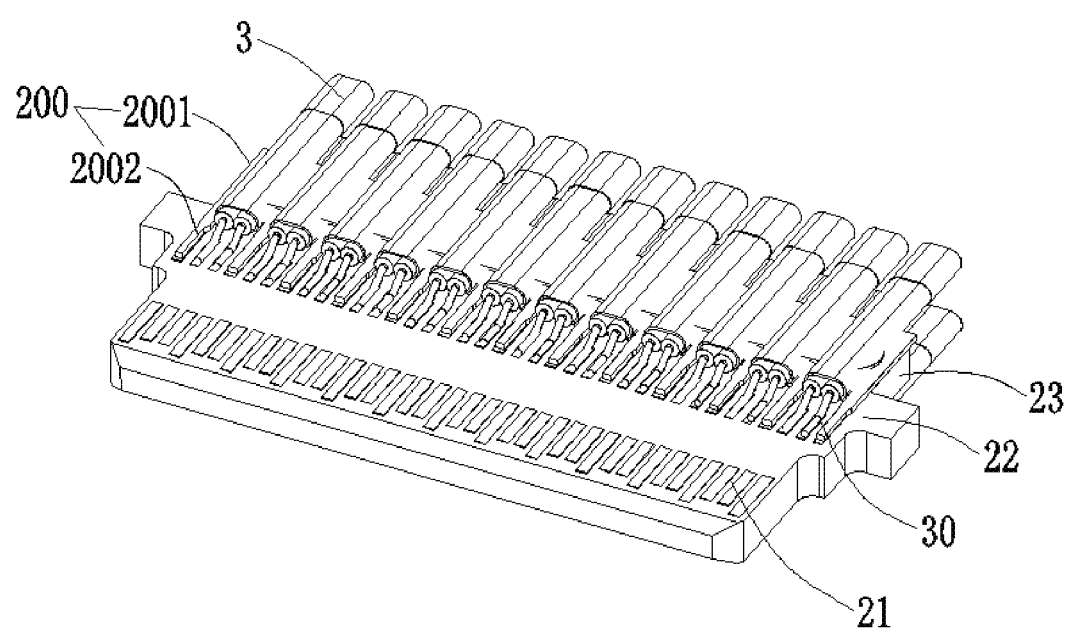
FIG. 22 shows a collaboration schematic diagram of a spacer main body disposed between cables without grounding wires and a grounding wire bonding pad according to Embodiment 7.

As shown in FIG. 19-22, differences between this embodiment and Embodiment 1 are as follows: a plurality of grounding terminals 221 and a plurality of signal terminals 222 are alternately arranged on the signal bonding pad 22, and pins 2002 of a signal pair spacer 200 and the core wires 30 of the cables without grounding wires 3 are respectively welded to the grounding terminals 221 and the signal terminals 222 of the signal bonding pad 22. A spacer main body 2001 can be disposed above the cables without grounding wires 3 (as shown in FIG. 20), and can also be disposed between the cables without grounding wires 3 and the grounding wire bonding pad 23 (as shown in FIG. 21). Through the extrusion of the front housing 11 and the rear housing 12, the cables without grounding wires 3, the spacer main body 2001 and the grounding wire bonding pad 23 are conducted together, thereby realizing the electrical and fixed connection of the cables without grounding wires 3 and the grounding wire bonding pad 23.

Embodiment 8

Figure 23A:
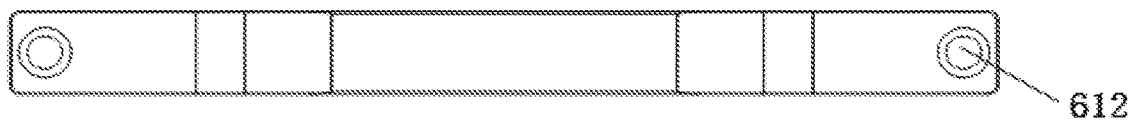
FIG. 23*a* shows a top view of a first base plate in an ultra high speed signal cable connector according to Embodiment 8.
Figure 23B:
FIG. 23*b* shows a side view of the first base plate.
Figure 24:
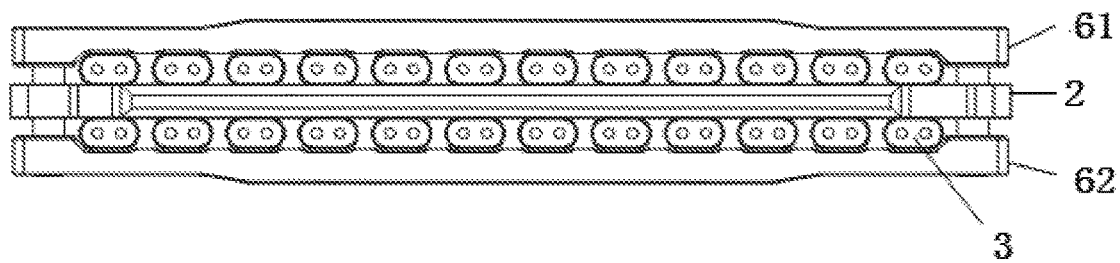
FIG. 24 shows a schematic assembled diagram of a first base plate, cables without grounding wires, a PCB and a second base plate according to Embodiment 8.

As shown in FIG. 23a, FIG. 23b and FIG. 24, differences between this embodiment and Embodiment 1 are as follows:

the connector further includes a pressing device, Wherein the pressing device includes a first base plate 61 and a second base plate 62 parallel to the first base plate 61, and the first base plate 61 is perpendicularly attached to the outer circumferences of the cables without grounding wires 3, namely, the outer walls of the insulating layers 33. The cables without grounding wires 3 are disposed on two sides of the PCB 2, the second base plate 62 is attached to the outer circumferences of cables without grounding wires 3 on the other side of the PCB 2, namely, the outer walls of the insulating layers 33. The first base plate 61 and the second base plate 62 are both metal plates.

The connecting members 7 are bolts, two ends of the PCB 2, namely, the left and right ends of the grounding wire bonding pad 23 are provided with first positioning holes 231 for allowing the bolts to pass through, two ends of the first base plate 61 are provided with second positioning holes 612, two ends of the second base plate 62 are provided with threaded holes 622, and the bolts sequentially pass through the first positioning holes 321 and the second positioning holes 612 and are in threaded connection to the threaded holes 622 to fix the first base plate 61 and the second base plate 62 onto the PCB 2.

The sides, attached to the cables without grounding wires 3, of the first base plate 61 and the second base plate 62 are provided with grooves 611 for accommodating the cables without grounding wires 3.

Embodiment 9

Figure 25:
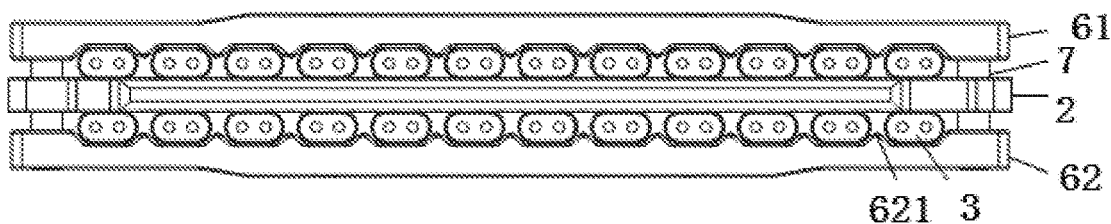
FIG. 25 shows a schematic assembled diagram of a first base plate, cables without grounding wires, a PCB and a second base plate in an ultra high speed signal cable connector according to Embodiment 9.
Figure 26:
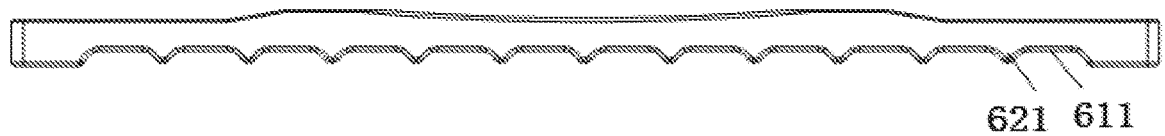
FIG. 26 shows a side view of a first base plate according to Embodiment 9.

As shown in FIG. 25 and FIG. 26, differences between this embodiment and Embodiment 1 are as follows:

the connector further includes a pressing device, wherein the pressing device includes a first base plate 61 and a second base plate 62 parallel to the first base plate 61, and the first base plate 61 is perpendicularly attached to the outer circumferences of the cables without grounding wires 3, namely, the outer walls of the insulating layers 33. The cables without grounding wires 3 are disposed on two sides of the PCB 2, the second base plate 62 is attached to the outer circumferences of cables without grounding wires 3 on the other side of the PCB 2, namely, the outer walls of the insulating layers 33. The first base plate 61 and the second base plate 62 are both metal plates.

The connecting members 7 are bolts, two ends of the PCB 2, namely, the left and right ends of the grounding wire bonding pad 23 are provided with first positioning holes 231 for allowing the bolts to pass through, two ends of the first base plate 61 are provided with second positioning holes 612, two ends of the second base plate 62 are provided with threaded holes 622, and the bolts sequentially pass through the first positioning holes 321 and the second positioning hole 612 and are in threaded connection to the threaded holes 622 to fix the first base plate 61 and the second base plate 62 onto the PCB 2.

The sides, attached to the cables without grounding wires 3, of the first base plate 61 and the second base plate 62 are provided with grooves 611 for accommodating the cables without grounding wires 3; and the groove bottoms of the grooves 611 are provided with a plurality of dividing strips 621 disposed in parallel with the cables without grounding wires and used for dividing the cables without grounding wires 3.

The assembly method of the present disclosure is described in detail as follows:

(1) welding the core wires 30 of the upper and lower rows of cables without grounding wires 3 to the signal bonding pad 22 of the PCB 2 by soldering iron or thermocompression bonding;

(2) enabling the conductive jackets 32 of the upper and lower rows of cables without grounding wires 3 to be in stationary contact with the grounding wire bonding pad 23 of the PCB 2, wherein the conductive jackets 32 can be electrically and fixedly connected with the grounding wire bonding pad 23 by any one of the manners in Embodiment 1 to 9;

(3) fixing the PCB 2 in the front housing 11 by the matching of the guiding blocks 201 on the side of the PCB 2 and the sliding groove tracks 112 of the front housing 11, and enabling the end portion of the connecting finger 21 of the PCB 2 to pass through the guiding hole 111 of the front housing 11 and extend out of the front housing 11;

(4) performing injection molding on the inner mold 4 by the melted plastic injection hole 10 in the side of the insulating housing 1 to fill the inner cavity of the insulating housing 1 with melted plastic and wrap all welding spots between the cables without grounding wires 3 and the PCB 2; and (5) installing the mounting portion 51 of the spring plate 5 into the mounting groove 113 of the front housing 11, and clamping the two limiting bayonets 512 on the spring plate 5 with the two clamping points 1131 on the top of the front housing 11.

In the step (2), When the conductive jackets 32 is electrically and fixedly connected with the grounding wire bonding pad 23 by any one of the manners in Embodiment 1, namely when the conductive jackets 32 of the upper and lower rows of cables without grounding wires 3 are electrically and fixedly to the grounding wire bonding pad 23 of the PCB 2 by conductive plastic 300, the conductive jackets 32 of the cable without grounding wires 3 is pressed together with the grounding wire bonding pad 23 of the PCB 2 with mold or tool firstly, then injecting the conductive plastic 300, thereby realizing the electrical and fixed connection of the conductive jackets 32 of the cables without grounding wires 3 and the grounding wire bonding pad 23 of the PCB 2.

The embodiments of the present disclosure have been described above, and the foregoing description is illustrative, but not limited, and is not limited to the disclosed embodiments. Many modifications and changes will be apparent to those skilled in the art without departing from the scope of the present disclosure.

The invention claimed is:

1. An ultra high speed signal cable connector, comprising:
an insulating housing,
a PCB fixedly mounted inside the insulating housing, and
at least one row of cables without grounding wires welded to the PCB, wherein the end portion of a connecting finger of the PCB extends out of the insulating housing, and the PCB is provided with signal bonding pads and a grounding wire bonding pad; each cable without grounding wires comprises a plurality of electric wires, a conductive jacket for wrapping the plurality of electric wires together, and an insulating jacket wrapped on the outer layer of the conductive jacket; each electric wire comprises a core wire and an insulating layer wrapped on the outer layer of the core wire; ends of the core wires are welded on the respective signal bonding pad; a section of insulating jacket is stripped from the foremost end of each cable without grounding wires to expose the conductive jacket; and the conductive jackets are electrically and fixedly connected to the grounding wire bonding pad;

wherein the insulating housing comprises a front housing and a rear housing, the rear portion of the front housing is provided with a plurality of clamping grooves, the front portion of the rear housing is provided with a plurality of buckles, the rear housing is assembled with the front housing together through the matching of the buckles and the clamping grooves; the top of the front housing is provided with a mounting groove for mounting a spring plate, the front end of the front housing is provided with a guiding hole, and the end portion of the connecting finger of the PCB passes through the guiding hole and extends out of the front housing.

2. The ultra high speed signal cable connector of claim 1, wherein two rows of cables without grounding wires are provided, and the two rows of cables without grounding wires are symmetrically disposed on the upper side and the lower side of the PCB.

3. The ultra high speed signal cable connector of claim 2, wherein the conductive jackets of the two rows of cables without grounding wires are fixed to the grounding wire bonding pad by plastic.

4. The ultra high speed signal cable connector of claim 2, wherein the conductive jackets of the upper and lower rows of cables without grounding wires are fixed to the grounding wire bonding pad by conductive glue.

5. The ultra high speed signal cable connector of claim 2, wherein the conductive jackets of the upper and lower rows of cables without grounding wires are electrically and fixedly connected to the grounding wire bonding pad by conductive rubber, the conductive rubber is pre-mounted on the PCB before the cables without grounding wires are welded to the PCB, and the conductive jackets on the cables without grounding wires are electrically and fixedly to the grounding wire bonding pad by the interference fit between the insulating housing and the cables without grounding wires.

6. The ultra high speed signal cable connector of claim 2, wherein the conductive jackets of the upper and lower rows of cables without grounding wires are electrically and fixedly connected to the grounding wire bonding pad by a ground lug, the ground lug is first fixed to the grounding wire bonding pad by means of welding or SMT, the ground lug is provided with a plurality of riveting claws for accommodating the cables, the cables are placed in the respective riveting claws in one-to-one correspondence, and bending jigs are adopted for riveting and fixing.

7. The ultra high speed signal, cable connector of claim 2, wherein the signal bonding pad is alternately provided with a plurality of grounding terminals, the conductive jackets of the upper and lower rows of cables without grounding wires are electrically and fixedly connected to the grounding wire bonding pad by a signal pair spacer, the signal pair spacer comprises a spacer main body and a plurality of pins extending forward from the front end of the spacer main body, the pins are welded on the grounding terminals, and the cables without grounding wires, the spacer main body and the grounding wire bonding pad are conducted together through the extruding interference of the insulating housing.

8. The ultra high speed signal cable connector of claim 7, wherein the spacer main body is disposed above the cables without grounding wires or is disposed between the cables without grounding wires and the grounding wire bonding pad.

9. The ultra high speed signal cable connector of claim 1, wherein the front housing is internally provided with sliding groove tracks, two sides of the PCB are each provided with a guiding block, and the PCB is mounted on the sliding groove tracks by the guiding, blocks.

10. The ultra high speed signal cable connector of claim 1, wherein the spring plate comprises a mounting portion and a connecting portion formed by obliquely bending upward from the rear end of the mounting portion, the front end of the mounting portion is provided with elastic catches, the mounting groove is internally provided with a plurality of clamping points, and the mounting portion is provided with a plurality of limiting bayonets matched with the clamping points.

11. The ultra high speed signal cable connector of claim 10, wherein the interior of the insulating housing is provided with an inner mold for covering welding spots between all the cables without grounding wires and the PCB, and the side of the insulating housing is provided with a melted plastic injection hole for injection molding of the inner mold.

12. The ultra high speed signal cable connector of claim 1, further comprising a pressing device, wherein the pressing device comprises a first base plate and connecting members, the first base plate is perpendicularly attached to the outer circumferences of the cables without grounding wires, and the connecting members are connected to the first base plate and the PCB to press the cables without grounding wires and the PCB.

13. The ultra high speed signal cable connector of claim 12, wherein the pressing device further comprises a second base plate parallel to the first base plate, the cables without grounding wires are disposed on two sides of the PCB, the first base plate is attached to the outer circumferences of cables without grounding wires on one side of the PCB, and the second base plate is attached to the outer circumferences of cables without grounding wires on the other side of the PCB;

the connecting members are sequentially connected to the first base plate, the PCB and the second base plate to press the cables without grounding wires and the PCB; and the first base plate and the second base plate are both metal plates.

14. The ultra high speed signal cable connector of claim 13, wherein the sides, attached to the cables without grounding wires, of the first base plate or the second base plate are provided with grooves for accommodating the cables without grounding wires.

15. The ultra high speed signal cable connector of claim 14, wherein the groove bottoms of the grooves are provided with a plurality of dividing strips disposed in parallel with the cables without grounding wires and used for dividing the cables without grounding wires.

16. The ultra high speed signal cable connector of claim 13, wherein the connecting members are rivets, two ends of the PCB are provided with first positioning holes, two ends of the first base plate and two ends of the second base plate are provided with second positioning holes, and the rivets pass through the first positioning holes and the second positioning holes to rivet the first base plate and the second base plate onto the PCB.

17. The ultra high speed signal cable connector of claim 13, wherein the connecting members are bolts, two ends of the PCB are provided with first positioning holes, two ends of the first base plate are provided with second positioning holes, two ends of the second base plate are provided with threaded holes, and the bolts sequentially pass through the second positioning holes and the first positioning holes and are in threaded connection to the threaded holes.

18. The ultra high speed signal cable connector of claim 1, wherein each conductive jacket is a metal film, each insulating jacket is a plastic film, and each insulating layer is plastic.

19. An assembly method of the ultra high speed signal cable connector of claim 11, comprising the following steps:
- S1, welding the core wires of the cables without grounding wires to the signal bonding pad of the PCB;
- S2, electrically and fixedly connecting the conductive jackets of the cables without grounding wires to the grounding wire bonding pad of the PCB to play a role in conducting;
- S3, fixing the PCB in the front housing to enable the end portion of the connecting finger of the PCB to pass through the guiding hole of the front housing and extend out of the front housing;
- S4, performing injection molding on the inner mold by the melted plastic injection hole in the side of the insulating housing to fill the inner cavity of the insulating housing with melted plastic and wrap all welding spots between the cables without grounding wires and the PCB; and
- S5, installing the spring plate into the mounting groove at the top of the front housing, and clamping the limiting bayonets on the spring plate with the clamping points in the mounting groove.

\* \* \* \* \*